United States Patent [19]
Jones et al.

[11] Patent Number: 6,031,282
[45] Date of Patent: Feb. 29, 2000

[54] HIGH PERFORMANCE INTEGRATED CIRCUIT CHIP PACKAGE

[75] Inventors: Mark R. Jones, Mundelein; Theodore A. Khoury, Chicago, both of Ill.

[73] Assignee: Advantest Corp., Tokyo, Japan

[21] Appl. No.: 09/140,961

[22] Filed: Aug. 27, 1998

[51] Int. Cl.[7] .............................. H01L 23/48; H01L 23/52
[52] U.S. Cl. .......................... 257/692; 257/693; 257/697; 257/727
[58] Field of Search ...................... 257/718, 719, 257/726, 727, 782, 783, 692, 697, 693, 698, 773; 438/117, 108, 125, 126, 127, 106

[56] References Cited

U.S. PATENT DOCUMENTS

| | | | |
|---|---|---|---|
| 4,922,376 | 5/1990 | Pommer et al. | 257/718 |
| 5,637,923 | 6/1997 | Kasai et al. | 257/692 |
| 5,866,939 | 2/1999 | Shin et al. | 257/692 |

*Primary Examiner*—Sheila V. Clark
*Attorney, Agent, or Firm*—Muramatsu & Associates

[57] ABSTRACT

A high performance IC package provides high density electrical interconnection and packaging for a high speed and high bandwidth IC chip and is easily connected to or disconnected from a printed circuit board. The IC package includes an enclosure; an integrated circuit chip having a front face and a back face wherein the back face is attached to an inner ceiling of the enclosure; contacts formed on die pads on the front face through a photolithography process where each of the contacts has a base portion vertically formed on the die pad, a horizontal portion whose one end is formed on the base portion, and a contact portion vertically formed on another end of the horizontal portion; and an encapsulant provided on the front face of the integrated circuit chip for air tightly sealing. The contacts are projected through the encapsulant, and the horizontal portion of each of the contacts produces a contact force when the contact is pressed against a contact target.

14 Claims, 10 Drawing Sheets

HIGH PERFORMANCE INTEGRATED CIRCUIT CHIP PACKAGE

FIELD OF THE INVENTION

This invention relates to thermal and electrical packaging of integrated circuit (IC) chips, and more particularly, to a high performance IC chip package which provides high density electrical interconnection and packaging for a high speed and bandwidth IC chip and is easily connected or disconnected from a printed circuit board. The IC chip package of the present invention achieves a chip scale package (CSP) wherein a package size is equivalent to that of the IC chip encapsulated therein.

BACKGROUND OF THE INVENTION

During an integrated circuit production process, integrated circuit chips on a semiconductor wafer are tested for their electrical parameters and functionality. For use in a circuit or electronic product, integrated circuit chips must be separated from the wafer into individual chips and are incorporated into an individual protective package. Then, they may be mounted on a surface of a ceramic substrate with other components in hybrid or multichip modules, or connected directly on a printed circuit board. The present invention is directed to a new packaging technology used to protect integrated circuit chips.

There are a large number of package types for IC chips used in the industry. One type of IC package is so structured that leads are inserted in through-holes provided on a printed circuit board. FIG. 1 shows such an example of the conventional types of IC package called a dual-in-line package. The package includes a lower part 12 and an upper part (enclosure) 11. On the lower part 12, a die-attachment area 13 is provided so that an IC chip 10 is securely attached thereto. The IC package of FIG. 1 is further provided with outer leads 14 to be connected to a printed circuit board 19, inner leads 15 continuous to the outer leads 14, bonding wires (package connection) 16 connecting die pads (electrodes) on the IC chip 10 to the inner leads 15. The IC package is covered by the enclosure (upper part) 11 for protection and heat dissipation.

The example of FIG. 1 establishes connection from the IC chip 10 to a printed circuit board 19 by the outer leads 14 which are inserted in through-holes 17 of the circuit board 19 and electrically connected therebetween by soldering. The through-holes 17 are connected to circuit patterns 18 provided on the printed circuit board 19 for electronic signal passage. The dual-in line package of FIG. 1 has a feature of thick, sturdy body with two rows of outer leads coming out of the side, resulting in a sufficient physical strength and easy handling.

However, this type of IC package has relatively long electrical paths from the IC chip to the printed circuit board, resulting in a poor high frequency performance. Moreover, the outer leads are aligned in two rows at the side of the package, which limits the maximum available number of pins (leads). Thus, the dual-in-line package is not suitable for recent, high speed, high pin count IC chips.

Another type of IC package is a surface mount package in which leads of the IC package are connected to contact pads provided on the surface of the printed circuit board. An example of surface mount package is shown in a cross sectional view of FIG. 2. The example of FIG. 2 is called a ball grid array (BGA) package which is one of the promising types of surface mount package.

In FIG. 2, an IC chip 20 is attached to a package substrate 28 through a die attach 21 such as an adhesive. Die pads on the IC chip 20 are connected to corresponding trace pads 27 on the package substrate 28 via bonding wires 22. The trace pads 27 on the upper surface of the substrate 28 are connected to trace pads 27 on the bottom surface of the substrate via through-holes 24. Each of the trace pads 27 on the bottom surface is provided with solder bump 25, which is a ball like solder. Solder masks 26 are provided between the solder bumps 25 to electrically isolate the adjacent solder bumps from one another. Under the high temperature atmosphere, the solder bumps 25 are melted to establish electric connection with contact pads on the printed circuit board.

The BGA package shown in FIG. 2 has an advantage that it has a shorter lead length, resulting in an excellent high frequency performance such as a shorter delay time and sharp rising and falling edges of pulse signals. Another advantage of the BGA is a higher pin count in a relatively small package size, allowing it to arrange a large number of pins (leads) at the bottom of the package to connect to the printed circuit board. One of the disadvantages of the BGA package, however, is that the solder connections cannot be visually inspected. Another disadvantage of the BGA is that the package is not removable or not easily removable from the printed circuit board to replace with another.

SUMMARY OF THE INVENTION

Therefore, it is an object of the present invention to provide an IC package which establishes a high density electrical interconnection and high electrical performance for an integrated circuit chip.

It is another object of the present invention to provide an IC package which achieves a chip scale package (CSP) wherein a package size is equivalent to that of the chip encapsulated therein.

It is a further object of the present invention to provide an IC package which can be easily mounted on a printed circuit board and easily removed therefrom.

It is a further object of the present invention to provide an IC package which has contact structures directly provided on die pads of an integrated circuit chip, each of which produces a contact force by its beam structure.

It is a further object of the present invention to provide an IC package which has contact structures directly provided on PCB (printed circuit board) pads on a PCB in the IC package where the PCB pads are connected to die pads on an integrated circuit chip.

It is a further object of the present invention to provide an IC package which is associated with an attachment member to be easily connected to and disconnected from a printed circuit board.

In the present invention, an IC package has contacts directly formed on metallized pads (electrodes) of an integrated circuit or other dielectric substrate and projected from the IC package as leads for electrical connection with a printed circuit board or the like. The contacts are formed on the metallized pads by a photolithography technology established in the semiconductor production process.

The IC package of the present invention is comprised of: an enclosure made of insulation material with high thermal conductivity; an integrated circuit chip having a front face and a back face wherein the back face is attached to an inner ceiling of the enclosure through an adhesive; a plurality of contacts formed on die pads on the front face of the integrated circuit chip through a photolithography process wherein each of the contacts has a base portion vertically formed on the die pad, a horizontal portion whose one end is formed on the base portion, and a contact portion vertically formed on another end of the horizontal portion; and an encapsulant provided on the front face of the integrated circuit chip for air tightly sealing; wherein the plurality of contacts are projected through the encapsulant, and the horizontal portion of each of the contacts produces a contact force when the contact is pressed against a contact target.

In another aspect, the IC package of the present invention is comprised of: an enclosure made of insulation material with high thermal conductivity; an integrated circuit chip having a front face and a back face wherein the back face is attached to an inner ceiling of the enclosure through an adhesive and the front face has a plurality of die pads made of conductive metal; an elastomer whose upper surface contacts a center portion of the front face of the integrated circuit chip; a printed circuit board (PCB) substrate provided on a lower surface of the elastomer having a plurality of PCB pads made of conductive metal; a plurality of contacts formed on the PCB pads on the PCB substrate wherein each of the contacts is produced through a photolithography process and has a base portion vertically formed on the die pad, a horizontal portion, one end of which is formed on the base portion, and a contact portion vertically formed on another end of the horizontal portion; a plurality of leads for electrically connecting the die pads and the PCB; and an encapsulant provided over the front face of the integrated circuit chip and the PCB substrate for air tightly sealing; wherein the plurality of contacts are projected through the encapsulant, and the horizontal portion of each of the contacts produces a contact force when the contact is pressed against a contact target.

A further aspect of the present invention is a process for mounting the IC package to a printed circuit board. The mounting process is comprised of the steps of: attaching an adapter having a hook at a top end thereof to the printed circuit board; providing an IC package having a plurality of contacts produced through a photolithography process wherein each of the contacts is produced through a photolithography process and has a base portion vertically formed on the die pad, a horizontal portion whose one end is formed on the base portion, and a contact portion vertically formed on another end of the horizontal portion; positioning the IC package on the printed circuit board so that the contacts are placed on corresponding contact pads on the printed circuit board; applying a retainer having a fastening lever over the IC package; and engaging the fastening lever with the hook on the adapter and rotating the fastening lever to press the IC package toward the printed circuit board.

According to the present invention, the IC package is able to establish a high density electrical interconnection and high electrical performance for an integrated circuit chips and can achieve a chip scale package (CSP) wherein a package size is equivalent to that of the chip encapsulated therein. The IC package of the present invention can be easily mounted on a printed circuit board and easily removed therefrom. The IC package has unique contact structures directly formed on die pads of an integrated circuit chip or on electrodes on other substrates in which the contact structure produces a contact force by its spring force.

DETAILED DESCRIPTION OF THE PREFERRED EMBODIMENT

Figure 3:
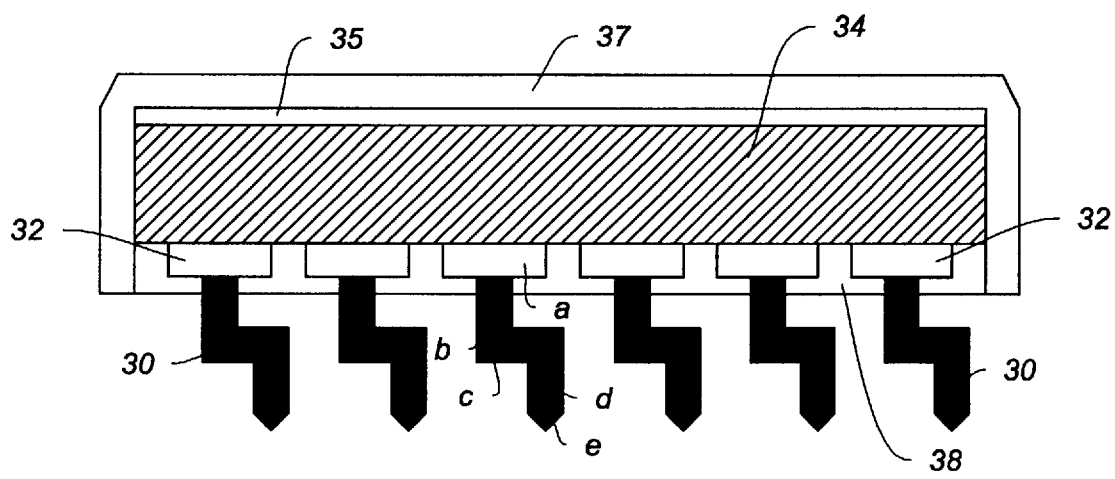
FIG. 3 is a cross sectional side view showing an IC package of the present invention.

The IC package of the present invention will be described with reference to FIGS. 3–8. FIG. 3 is a cross sectional side view showing an example of IC package of the present invention having a unique contact structure formed directly on an integrated circuit chip. Detailed description of the production process of the contact structure will be provided later with reference to FIGS. 5A–5R.

In the example of FIG. 3, an integrated circuit (IC) chip (active die) 34 is encapsulated in an enclosure 37 which is preferably made of electrically non-conductive and thermally conductive materials such as ceramic or plastic. The active die 34 may be attached to the enclosure 37 through an adhesive 35 for achieving a physical strength as well as heat dissipation from the IC chip 34 to the atmosphere via the enclosure 37. On the surface of the IC chip 34, a plurality of die pads 32 are provided as electrodes for inner circuits. Contacts 30 are formed directly on the die pads 32 of the active die 34 through a photolithography process. The bottom part of the IC package is molded by an encapsulant 38 such as epoxy resin for air tight sealing.

Each of the contact 30 has a shape as shown in FIG. 3 which is built on the die pad 32 also designated by reference label a. The contact 30 has vertical portions b and d and a horizontal beam c and a tip portion e. The tip portion e of the contact 30 is preferably sharpened to achieve a scrubbing effect when pressed against a contact target such as a contact pad of a printed circuit board. For example, if a contact target such as on a printed circuit board has gold or aluminum oxide on its surface, the scrubbing effect is usually necessary to establish sufficient electric contact with low contact resistance.

The spring force of the horizontal beam c provides an appropriate contact force against the contact target on the printed circuit board. The elasticity produced by the spring force of the horizontal beam c also functions to compensate the differences in size or the fluctuation of flatness (planarity) involved in the contacts 30 and the contact targets such as the contact pads on the printed circuit board.

An example of material of the contact 30 includes nickel, aluminum and copper. The tip portion e may be plated by nickel palladium, rhodium, nickel gold, iridium or several other depositable materials. An example of size of the contact 30 intended for IC leads may be 100–400 microns (about 200 µm optimum) in overall height, 50–400 microns (150–200 µm optimum) in horizontal length, and about 30–60 microns in thickness for the pitch of 50 µm between contact targets.

Figure 4:
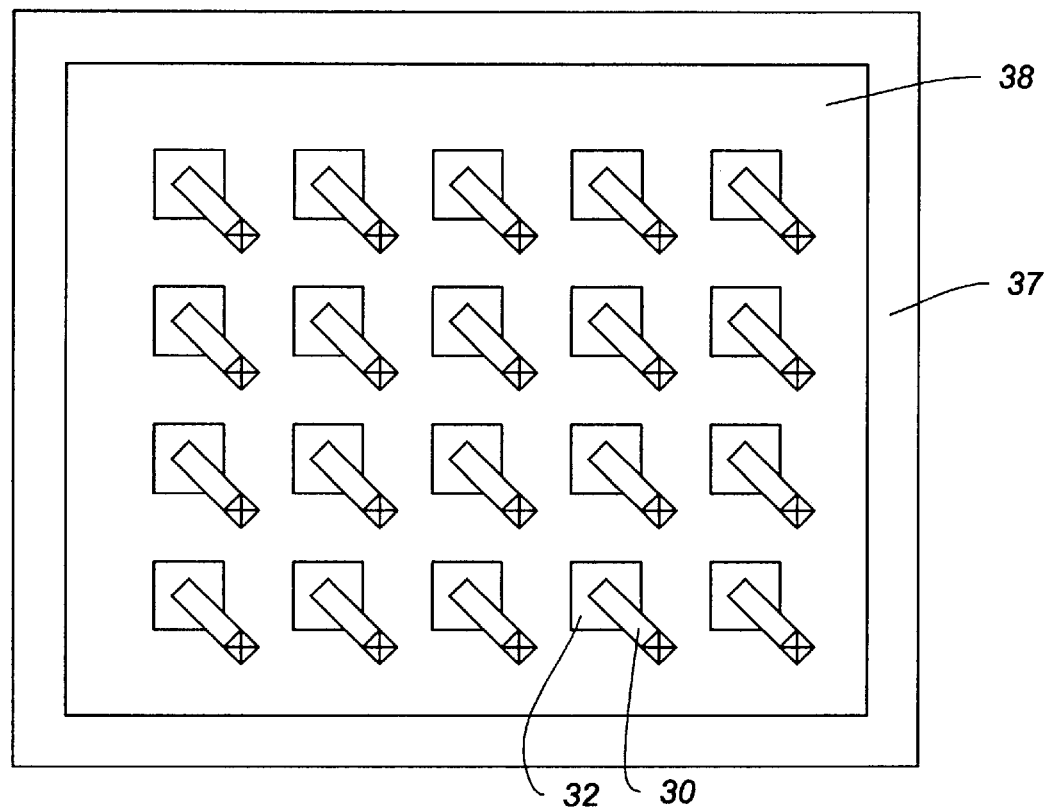
FIG. 4 is a bottom view showing the IC package of FIG. 3 in accordance with the present invention.

FIG. 4 is a bottom view of the IC package of the present invention in FIG. 3. A plurality of pairs of die pad and contact 30 are aligned at the bottom surface of the IC package which is air tightly sealed by the encapsulant 38 in the enclosure 37. Since the contacts 30 are directly mounted on the die pads 32 of the active die 34, there is no positional limitation of the die pads 32 and the contact 30. Thus, a large number of contacts 30 can be provided on the IC package of the present invention.

Figure 5A:
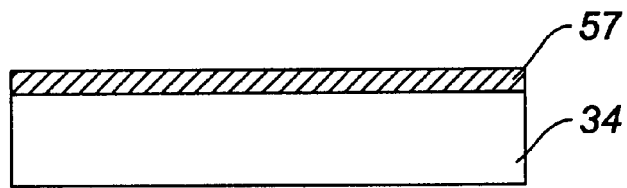
FIGS. 5A–5R are schematic diagrams showing an example of production process for producing the contact structure of the IC package of the present invention.
Figure 5B:
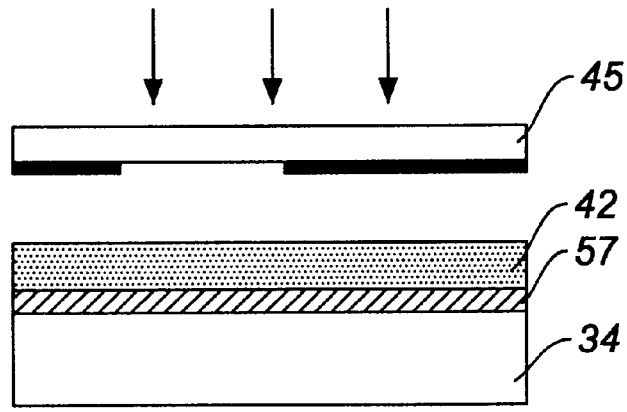
Figure 5C:
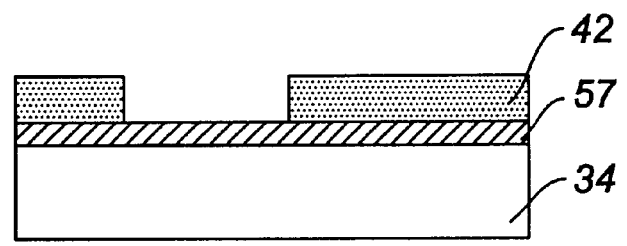
Figure 5D:
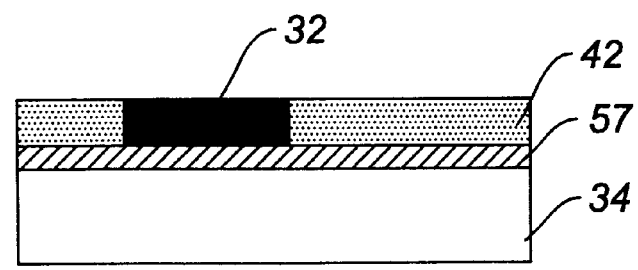
Figure 5E:
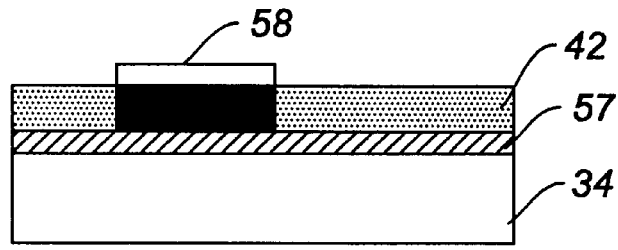
Figure 5F:
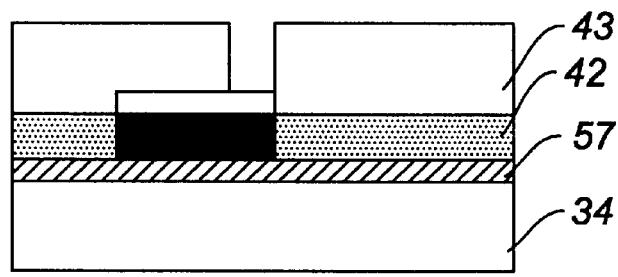
Figure 5G:
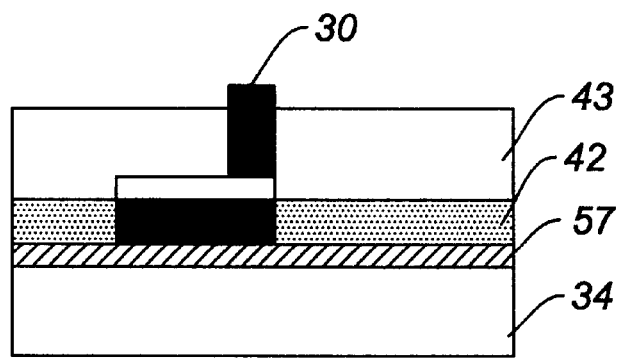
Figure 5H:
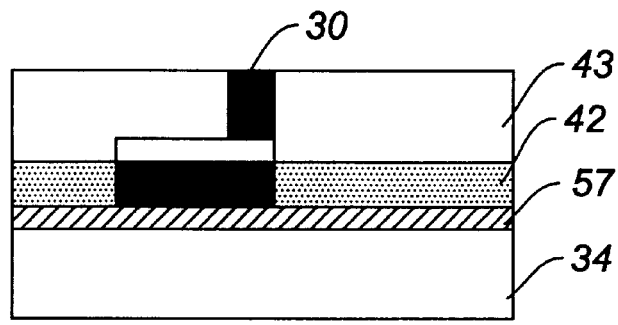
Figure 5I:
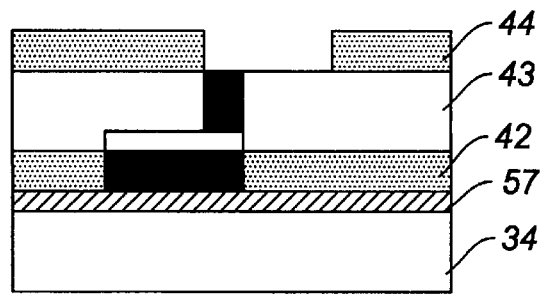
Figure 5J:
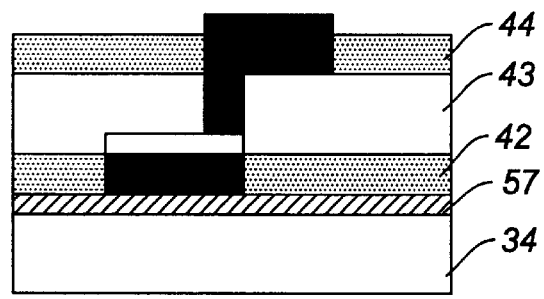
Figure 5K:
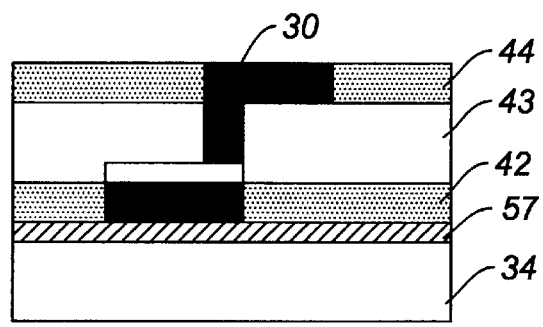
Figure 5L:
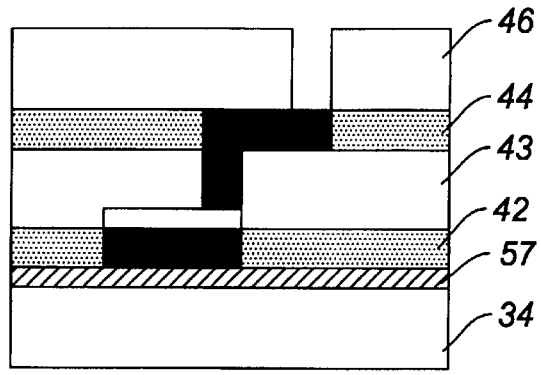
Figure 5M:
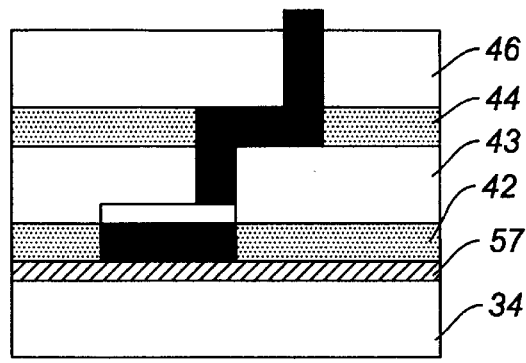
Figure 5N:
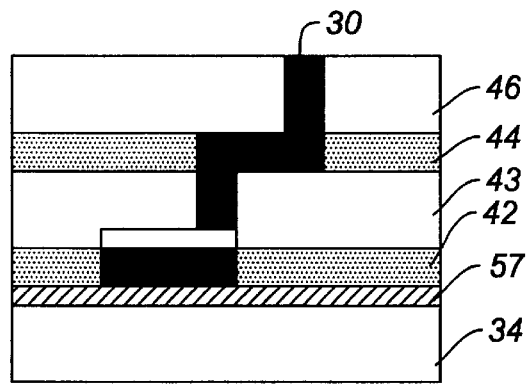
Figure 5O:
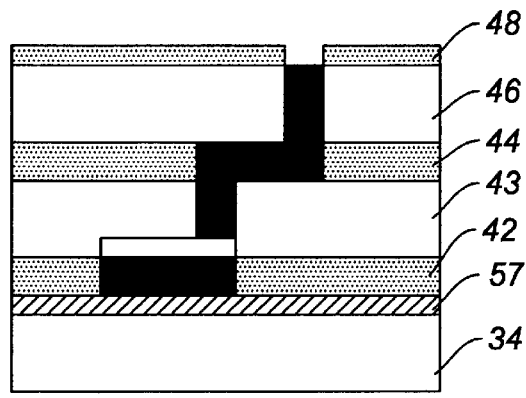
Figure 5P:
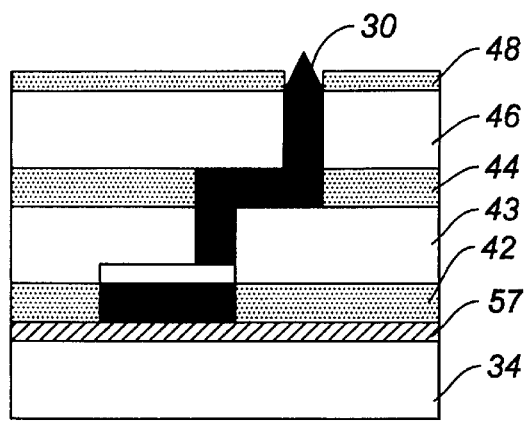
Figure 5Q:
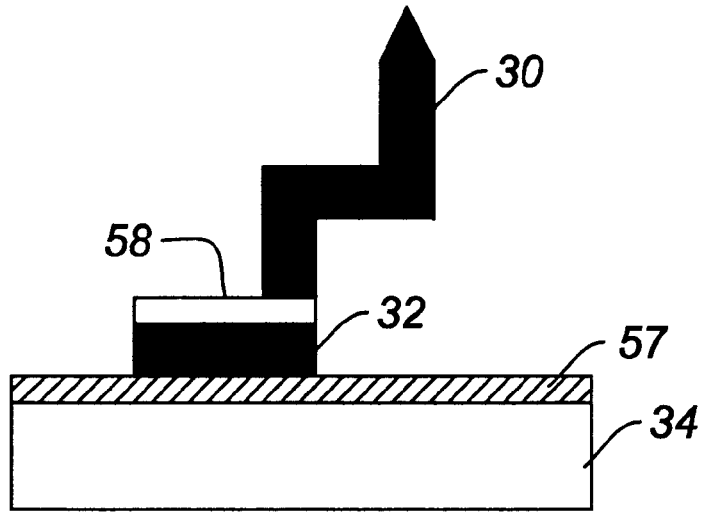
Figure 5R:
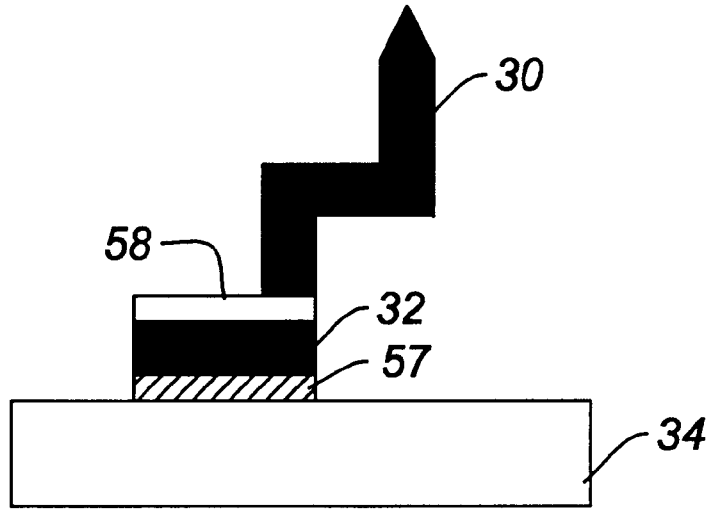

FIGS. 5A–5R show an example of process for producing the contacts 30 of the present invention through the photolithography technology. In FIG. 5A, a thin metal layer 57 made, for example of copper, is provided on the silicon substrate (active die) 34. The metal layer 57 is to achieve electrical conductivity for forming the die pad (interconnect trace) 32 and contact 30 of FIG. 3 through a electroplating process. If the die pad 32 and contact 30 are formed through other deposition processes such as sputtering, evaporation or other processes, the thin metal layer 57 may not be necessary.

A photoresist layer 42 is formed on the die pad layer 32 over which a mask 45 is aligned to be exposed with ultraviolet light as shown in FIG. 5B. If a positive acting resist is used, the photoresist covered by the opaque portions of the mask 45 harden (cure) after exposure. The exposed part of the resist can be dissolved and washed away, leaving a photo mask layer 42 of FIG. 5C. The contact material such as copper, nickel, aluminum or other metal is deposited in the window of the photo mask layer 42 to form the die pad 32 as shown in FIG. 5D. The die pad 32 of FIG. 5D thus formed corresponds to the portion a shown in FIGS. 3 and 4.

In the process of FIG. 5E, a thin metal layer 58 is formed by, for example plating, on the die pad (interconnect trace) 32. One of the purposes of the metal layer 58 is to protect the die pad 32 from etching in the later process. Materials of the metal layer 58 should be different from that of the die pad 32 or thin metal layer 57. In FIG. 5F, a photo mask layer 43 is formed on the photo mask 42 through the same photolithography process of FIGS. 5B and 5C. In FIG. 5G, the contact material such as nickel, aluminum and copper is deposited in the window of the photo mask 43 to form the vertical portion b of the contact 30 shown in FIG. 3. A variety of deposition techniques can be used in this process including vacuum evaporation, cathode sputtering, vapor-phase deposition as well as plating techniques. The overplated portion of FIG. 5G is removed in the grinding (planarizing) process of FIG. 5H.

The foregoing process will be repeated for forming the other portions of the contact 30. In FIG. 5I, using the photolithography process of FIGS. 5B and 5C, a photo mask layer 44 is created over the photo mask layer 43 to form the horizontal beam c of the contact 30. Through the deposition process, the horizontal beam c is formed as shown in FIG. 5J for which a planarizing process is performed to remove the overplated portion as shown in FIG. 5K. Further, on the photo mask 44 and the horizontal beam c, a photo mask layer 46 is provided as shown in FIG. 5L to form the vertical portion d of the contact 30. The photo mask 46 is created by the same photolithography process of FIGS. 5B and 5C. Thus, after the deposition, the vertical portion d of FIG. 3 is formed in the photo mask layers as shown in FIG. 5M for which a planarizing process is performed to remove the overplated portion as shown in FIG. 5N. FIG. 5O also shows a photo mask 48 to form a tip e of the contact 30 which is shown in FIG. 5P.

In FIG. 5Q, the photo masks 42, 43, 44, 46 and 48 are stripped off in a special solvent well known in the photolithography technology. An etching process is conducted on the structure shown in FIG. 5Q so that most of the metal layer 57 is removed as shown in FIG. 5R. As in the foregoing, the contact 30 and the die pad (interconnect trace) 32 are formed on the active die (silicon substrate) 34 by the photolithography technology.

Figure 6:
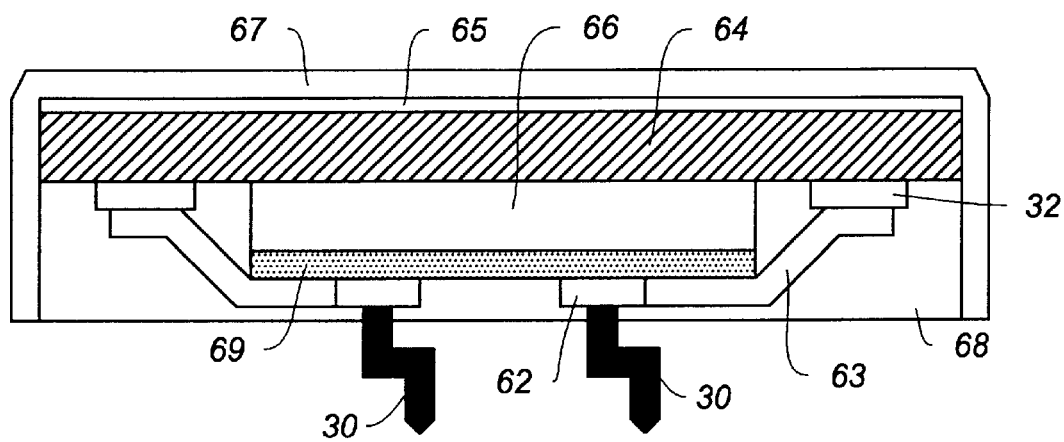
FIG. 6 is a cross sectional side view of another example of IC package of the present invention.

FIG. 6 is a cross sectional side view of another example of IC package of the present invention. In the example of FIG. 6, an integrated circuit chip (active die) 64 is encapsulated in an enclosure 67 which is preferably made of electrically non-conductive and thermally conductive materials such as ceramic or plastic. The active die 64 may be attached to the enclosure 37 through an adhesive 65 for achieving a physical strength as well as heat dissipation. The bottom part of the IC package is molded by an encapsulant 68 such as epoxy resin for air tight sealing.

An elastomer 66 is provided between the bottom surface of the active die 64 and a PCB (printed circuit board) substrate 69. The PCB 69 has PCB pads (electrodes) 62 on which the contacts 30 are projected in a manner shown in FIG. 6. The die pad 32 on the active die 64 and the PCB pad 62 on the PCB substrate 69 are connected through a lead 63 such as a conductor pattern formed on a flexible PCB. The elastomer 66 provides flexibility, such as a horizontal displacement, between the contacts 30 and the active die 64 when the IC package is pressed against a printed circuit board or when temperature substantially changes.

Figure 1:
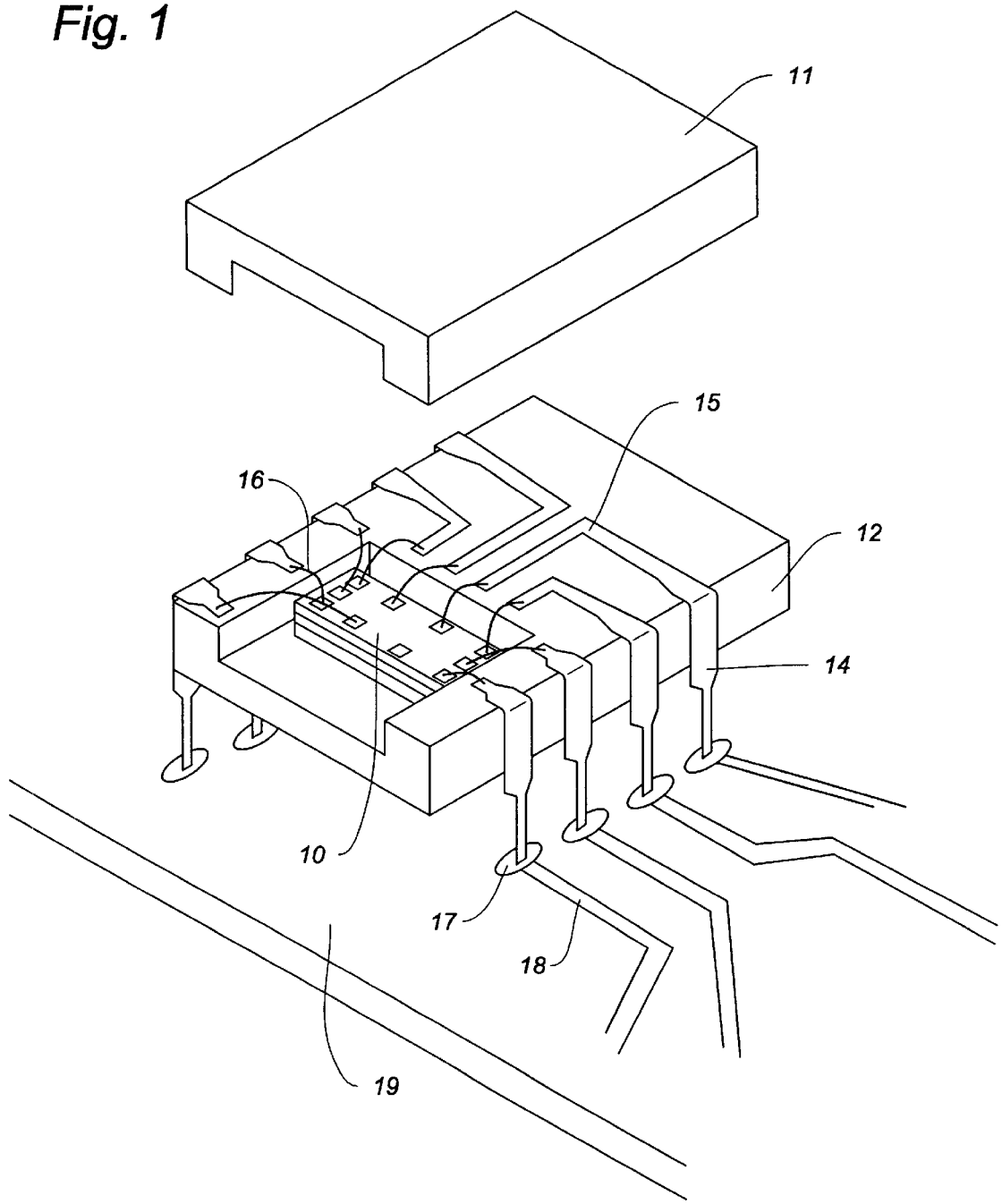
FIG. 1 is a perspective view showing an exemplified structure of a conventional IC package.
Figure 2:
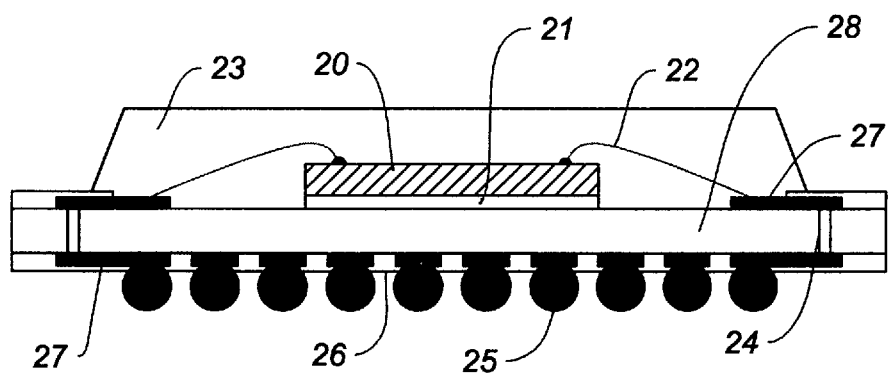
FIG. 2 is a cross sectional side view of another example of conventional IC package.

In this example, the die pads 32 are provided at the periphery of the active die 64 and the contacts 30 are provided at the center area of the IC package. Thus, the number of contacts available in the example of FIG. 2 may be lower than that of FIG. 3. Similar to the example of FIG. 3, the contacts 30 are formed directly on the PCB pads 62 through the photolithography process such as shown with reference to FIGS. 5A–5R.

Figure 7:
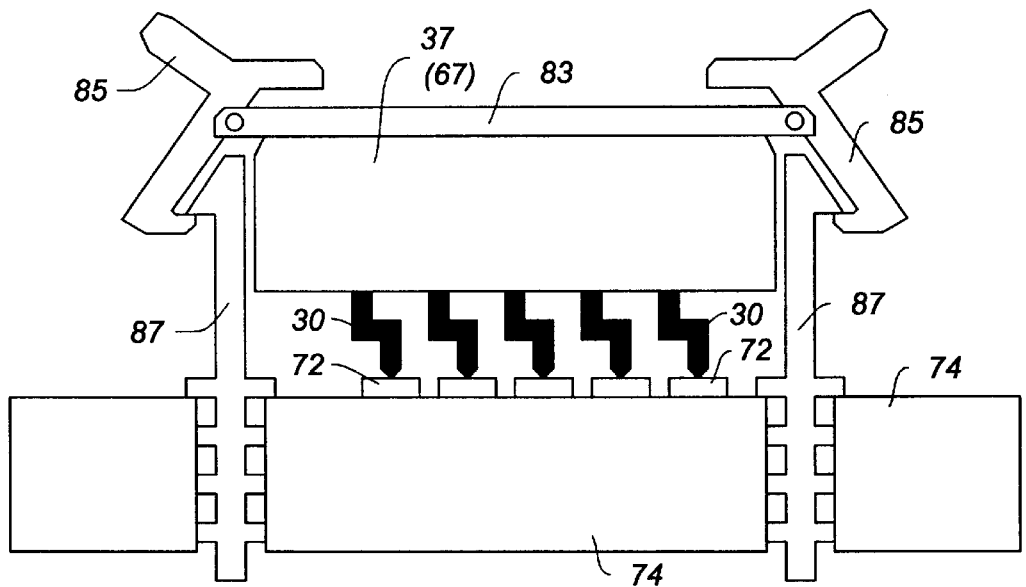
FIG. 7 is a cross sectional side view showing an example of structure for attaching an IC package of the present invention to a printed circuit board.
Figure 8:
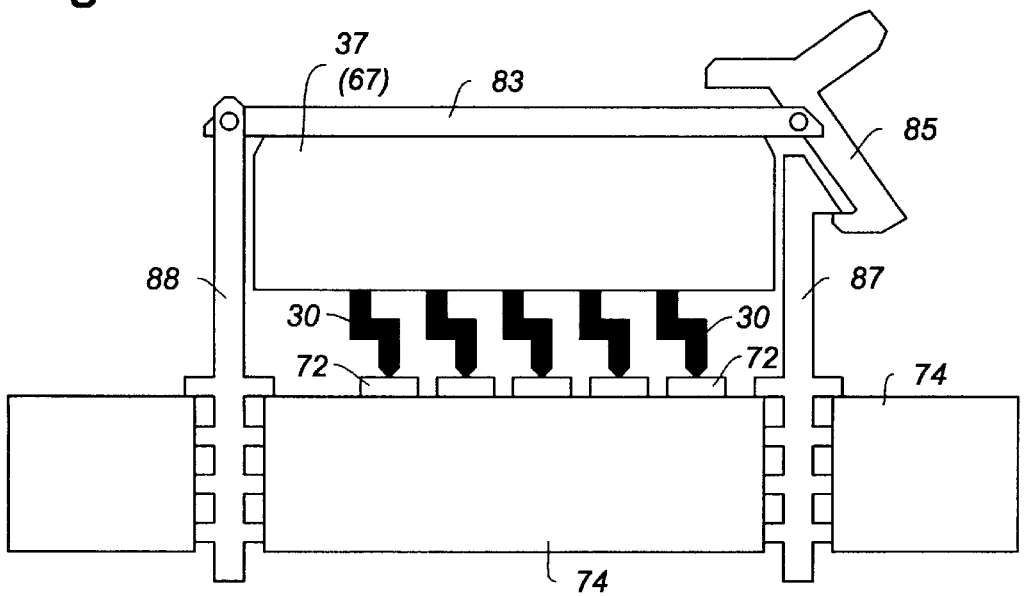
FIG. 8 is a cross sectional side view showing another example of structure for attaching an IC package of the present invention to a printed circuit board.

FIGS. 7 and 8 are cross sectional side views showing examples of structure for attaching the IC package of the present invention to a printed circuit board. In the example of FIG. 7, the IC package of the present invention is mounted on a printed circuit board by an attachment mechanism having a pair of fastening levers. In this example, a retainer 83 having a pair of fastening levers 85 at each end is provided to press the top surface of the enclosure 37 (67) of the IC package. A pair of adapters 87 are attached to a printed circuit board 74 by means of press fit, for example. Each of the adapters 87 has a hook on its top end to fit with the corresponding fastening lever 85 as shown in FIG. 7. Thus, when the attachment mechanism is fastened, the contacts 30 of the IC package are pressed against contact pads 72 on the printed circuit board 74 to establish electrical connection therebetween. In the example of FIG. 8, an attachment mechanism has a fastening lever 85 on one end of the retainer 83. An adapter 88 may be mechanically connected to the retainer 83. Preferably, the fastening levers 85 are spring activated to easily attach or remove the IC package from the printed circuit board.

As has been foregoing, according to the present invention, the IC package is able to establish a high density electrical interconnection and high electrical performance for an integrated circuit chips and can achieve a chip scale package (CSP) wherein a package size is equivalent to that of the chip encapsulated therein. The IC package of the present invention can be easily mounted on a printed circuit board and easily removed therefrom. The IC package has unique contact structures directly formed on die pads of an integrated circuit chip or on electrodes on other substrates in which the contact structure produces a contact force by its spring force.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An IC package, comprising:

an enclosure made of insulation material with high thermal conductivity;

an integrated circuit chip having a front face and a back face, said back face being attached to an inner ceiling of said enclosure;

a plurality of contacts formed on die pads on the front face of said integrated circuit chip, each of said contacts having a base portion vertically formed on said die pad, a horizontal portion, one end of which being formed on said base portion, and a contact portion vertically formed on another end of said horizontal portion; and an encapsulant provided on said front face of said integrated circuit chip for air tightly sealing said IC package;

wherein substantially all portions of said plurality of contacts are projected through said encapsulant to a free space to allow free movements of said horizontal portion and said contact portion, and wherein said horizontal portion of each of said contacts produces a contact force when said contact is pressed against a contact target, thereby allowing said contact portion to move in both vertical and horizontal directions in said free space.

2. An IC package as defined in claim 1, wherein said die pads on said integrated circuit chip are made of metal and formed through a metallization process including deposition, evaporation, sputtering or plating.

3. An IC package as defined in claim 1, wherein said contacts are directly formed on said die as to establish electrical connection therebetween.

4. An IC package as defined in claim 1, wherein said contacts are made of metal and formed through a deposition process after forming a photo mask on said die pads.

5. An IC package as defined in claim 1, wherein said contacts are formed on said die pads by repeating at least three photolithography processes, each of said photolithography processes includes steps of photoresist coating, masking, exposure, photoresist stripping and conductive material deposition.

6. An IC package as defined in claim 1, wherein material of said contact portion of said contact includes materials other than that used to form the contact of the design.

7. An IC package, comprising:

an enclosure made of insulation material with high thermal conductivity;

an integrated circuit chip having a front face and a back face, said back face being attached to an inner ceiling of said enclosure through an adhesive and said front face having a plurality of die pads made of conductive metal;

an elastomer provided within said enclosure, an upper surface of said elastomer contacting a center portion of the front face of said integrated circuit chip;

a printed circuit board (PCB) substrate provided within said enclosure on a lower surface of said elastomer having a plurality of PCB pads made of conductive metal;

a plurality of contacts formed on said PCB pads on said PCB substrate, each of said contacts having a base portion vertically formed on said die pad, a horizontal portion, one end of which being formed on said base portion, and a contact portion vertically formed on another end of said horizontal portion;

a plurality of leads connecting said die pads on said integrated circuit chip and the PCB pads on said PCB substrate; and an encapsulant provided over said front face of said integrated circuit chip and the PCB substrate for air tightly sealing said IC package;

wherein substantially all portions of said plurality of contacts are projected through said encapsulant to a free space to allow free movements of said horizontal portion and said contact portion, and wherein said horizontal portion of each of said contacts produces a contact force when said contact is pressed against a contact target, thereby allowing said contact portion to move in both vertical and horizontal directions in said free space.

8. An IC package as defined in claim 7, wherein said die pads on said integrated circuit chip are made of metal and formed through a metallization process including deposition, evaporation, sputtering or plating.

9. An IC package as defined in claim 7, wherein said contacts are directly formed on said die pads to establish electrical connection therebetween.

10. An IC package as defined in claim 7, wherein said contacts are made of metal and formed through a deposition process after forming a photo mask on said die pads.

11. An IC package as defined in claim 7, wherein said contacts are formed on said die pads by repeating at least three photolithography processes, each of said photolithography processes includes steps of photoresist coating, masking, exposure, photoresist stripping and conductive material deposition.

12. An IC package as defined in claim 7, wherein material of said contact portion of said contact includes materials other than that used to form the contact portion of the design.

13. A method of mounting an IC package on a printed circuit board, comprising the steps of:

attaching an adapter to said printed circuit board, said adopter having a hook at a top end thereof;

providing an IC package having a plurality of contacts formed on die pads of a semiconductor chip in said IC package through a photolithography process, each of said contacts being produced through a photolithography process and having a base portion vertically formed on said die pad, a horizontal portion, one end of which being formed on said base portion, and a contact portion vertically formed on another end of said horizontal portion;

positioning said IC package on said printed circuit board so that said contacts are placed on corresponding contact pads on said printed circuit board;

applying a retainer having a fastening lever over said IC package; and engaging said fastening lever with said hook on said adapter and rotating said fastening lever to press said IC package toward said printed circuit board.

14. A method of mounting an IC package on a printed circuit board as defined in claim 13, wherein said adapter includes a pair of rod like members, a bottom part of each members is press fit in a through-hole of said printed circuit board, and said retainer has said fastening lever at each end thereof.

* * * * *